(12) United States Patent
Yoshida et al.

(10) Patent No.: US 7,579,606 B2
(45) Date of Patent: Aug. 25, 2009

(54) METHOD AND SYSTEM FOR LOGIC DESIGN FOR CELL PROJECTION PARTICLE BEAM LITHOGRAPHY

(75) Inventors: Kenji Yoshida, Tokyo (JP); Takashi Mitsuhashi, Fujisawa (JP); Shohei Matsushita, Yokohama (JP); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 320 days.

(21) Appl. No.: 11/607,305

(22) Filed: Dec. 1, 2006

(65) Prior Publication Data

US 2008/0128637 A1 Jun. 5, 2008

(51) Int. Cl.
*G21K 5/04* (2006.01)
*G06F 17/50* (2006.01)

(52) U.S. Cl. .............. 250/492.22; 250/492.1; 250/492.2; 250/492.23; 716/19; 716/21

(58) Field of Classification Search .............. 250/492.2, 250/491.1, 492.22, 492.3, 492.23, 492.24, 250/492.1; 430/296, 269, 297, 298, 299, 430/302; 716/1, 2, 9, 12, 17, 19, 21
See application file for complete search history.

(56) References Cited

U.S. PATENT DOCUMENTS

| | | | |
|---|---|---|---|
| 5,350,704 A * | 9/1994 | Anderson et al. ........... 438/129 |
| 6,560,768 B2 | 5/2003 | Inanami et al. | |
| 6,718,532 B2 * | 4/2004 | Inanami et al. ............... 716/19 |
| 6,782,524 B2 * | 8/2004 | Rittman ........................ 716/19 |
| 2001/0028991 A1 * | 10/2001 | Inanami et al. ............. 430/296 |
| 2002/0010905 A1 * | 1/2002 | Inanami et al. ............... 716/21 |
| 2002/0010906 A1 * | 1/2002 | Inanami et al. ............... 716/21 |
| 2008/0116399 A1 * | 5/2008 | Fujimura et al. ......... 250/492.22 |

OTHER PUBLICATIONS

Sugihara et al, "Technology mapping technique for throughput enhancement of character projection equipment", Proceedings Spie 6151 61510Z (2006), Spie, Box 10, Bellingham, Wa 98227. (Paper attached: file name "PSISDG_6151_1_61510Z_1.pdf").

(Continued)

*Primary Examiner*—David A Vanore
*Assistant Examiner*—Nicole Ippolito Rausch
(74) *Attorney, Agent, or Firm*—The Mueller Law Office, P.C.

(57) ABSTRACT

A method for particle beam lithography, such as electron beam (EB) lithography, includes predefining a stencil design having a plurality of cell patterns with information from a cell library, fabricating the stencil design, synthesizing a functional description into a logic circuit design after predefining the stencil design so that one or more characteristics of the stencil design are considered during synthesizing of the functional description into the logic circuit design, optimizing the logic circuit design, generating a layout design from the optimized logic circuit design, and forming the logic circuit on a substrate according to the stencil design and the layout design.

61 Claims, 8 Drawing Sheets

OTHER PUBLICATIONS

Hattori, K. et al., "Electron Beam Direct Writing System Ex-8D Employing Character Projection Exposure Method", Journal of Vacuum Science Technology, Vol. B11(6) (1993), pp. 2346-2351, 1993, American Vacuum Society, 125 Maiden Lane, 15th Floor, New York, Ny 10038. (Paper attached: file name "electron_bearn.pdf").

Hara, S. et al., "Character Projection EB Data Conversion System Combined with Throughput Analyzer", Japanese Journal of Applied Physics, Vol. 33 (1994), pp. 6935-6939, Japan Society of Applied Physics, Kudan-Kita building 5th floor, Kudan-Kita 1-12-3, Chiyoda-ku, Tokyo 102-0073, Japan. (Paper attached: file name "character_projection.pdf").

Nakasugi, T. et al. "Maskless Lithography Using Low Energy Electron Beam: Recent Results of Proof-of-Concept Tool", Journal of Vacuum Science Technology, Vol. B20(6) (2002), pp. 2651-2656, American Vacuum Society, 125 Maiden Lane, 15th Floor, New York, Ny 10038. (Paper attached: file name "maskless.pdf").

Fujino, T. et al., "Character-Build Standard-Cell Layout Technique for High-Throughput Character-Projection EB Lithography", Proceedings Spie Vol. 5853 (2005), pp. 161-167, Spie, Box 10, Bellingham, Wa 98227. (Paper attached: "character_built.pdf").

Kazama, T. et al., "Shot reduction technique for character projection lithography using combined cell stencil", Proceedings Spie Vol. 5992, 59922V (2005), Spie, Box 10, Bellingham, Wa 98227. (Paper attached: file name "shot. pdf").

* cited by examiner

Standard Cell Library
AND-NOR-221

CP cell not available
Shot: 138 (VSB)
Area: 11.3µm²

Standard Cell combination #1
(Only Inverting logics available)
Shot: 35 (CP) + α (VSB)
Area: 22.6µm²

Standard Cell combination #2
(Non-inverting logics available)
Shot: 23 (CP) + α (VSB)
Area: 14.1µm²

METHOD AND SYSTEM FOR LOGIC DESIGN FOR CELL PROJECTION PARTICLE BEAM LITHOGRAPHY

BACKGROUND

1. Field

The field of the present invention relates to particle beam lithography and, in particular, to logic design for cell projection particle beam lithography.

2. Description of Related Art

In today's semiconductor manufacturing process, optical lithography using photomasks is commonly used. However, mask cost, which is rapidly growing with shrinking feature size, is becoming a serious problem for semiconductor manufacturing. To solve this issue, various approaches that do not use a photomask, such as maskless lithography, have been proposed. One of the promising maskless lithography approaches is electron beam (EB) direct writing (EBDW). However, the problem with this approach has been its relatively low throughput, which has hindered its use for volume production. Thus, EBDW has been applied only for research and for interconnect layers of production application-specific integrated circuits (ASICs).

To reduce EB writing time, a cell projection (CP) technique has been proposed. Cell projection EB technology uses a stencil mask which contains cell patterns and which enables a cell pattern to be written or drawn by one shot, reducing overall writing time compared to the conventional variable shaped beam (VSB) method.

FIG. 1 shows a concept of cell projection EB writing. An electron beam source 100 projects an electron beam 102 that is formed into a rectangular shape 108 with a rectangular aperture 104 formed in a first aperture 106 and then is projected through a second aperture 110 formed in a stencil mask 112.

A conventional VSB machine usually uses relatively simple patterns as the apertures 110 of stencil mask 112 to form rectangular or triangular shapes with variable sizes and projects them onto a surface of a wafer or substrate 116. Design patterns 114 on the wafer 116 are formed by combinations of those simple rectangular or triangular shapes. On the other hand, in the case of cell projection, the stencil mask 112 may include more complex patterns as apertures 110 of the stencil mask 112. Each aperture pattern 110 can be any complex pattern of 10×10 square microns in size, as an example. Typical examples of such patterns contained on stencil masks are patterns of standard cell library entities such as logic gates or flip-flops.

FIG. 2 shows an example of the cell pattern layout 200 on a stencil mask 202 having a plurality of cell areas 204. The number of cell areas may be, for example, 100, depending on the cell area size. By choosing one of such cells, a cell pattern can be drawn on a wafer by one shot of EB exposure, compared to ten or more shots in the case of VSB, thus enabling writing time reduction.

However, the problem of CP is the limitation of the number of cells that can be contained in one stencil mask. Since the cell library of ASICs usually has 300 to 500 cells and the stencil mask should contain all the necessary orientations of each cell, all the cell patterns needed cannot be accommodated on the stencil mask. The limited number of cells on the stencil results in the case that only a part of the cells used in the integrated circuit or chip can be drawn with CP, which results in a limited throughput improvement.

Referring to FIG. 3, a conventional large scale integrated circuit (LSI) design flow 300 includes logic design and stencil design. In general, logic synthesis is used as a technique for optimally designing logic circuits, usually starting with a functional description 310, such as a register transfer level (RTL) description and various constraints 312 for the logic circuit design. The functional description 310 is first transformed into a logic circuit by logic transformation 322 and is then converted by technology mapping 324 to the final logic circuit 330, which consists of cell entities of a given cell library 304, which is pre-designed in step 302 for a given process technology, and which comprises a set of standard cells that have implementation details such as layout patterns and performance data.

In the course of the logic synthesis process 320, a set of parameters and constraints is used for optimization. Commonly used parameters and constraints include delay (timing information), power consumption, and area (physical size). After layout design 340, in the case of cell projection EB, a stencil mask 354 for CP is designed in step 350 and fabricated in step 352. In designing the stencil mask, frequently used cell patterns are included in the stencil as much as possible to reduce the EB writing time. Then, the layout design 340 and stencil design 350 are used for EB data preparation in step 360, and EB data 362 therefrom is used along with the stencil 354 to EB write and fabricate in step 370 the logic circuit 330 according to the layout design 340 on a wafer or substrate 380. This flow of LSI design and stencil design has been commonly applied for EB writing.

However, due to stencil capacity limitation, a substantial number of cells cannot be included in the stencil, forcing the patterns for these cells to be drawn by VSB shots. Thus, the writing time reduction by CP is limited. This is because no consideration on writing time is given during logic design process in the conventional design flow 300.

There currently exists a need to improve logic design for cell projection (CP) electron beam (EB) lithography.

SUMMARY

This invention is related to a method and system for logic design of integrated circuits to be manufactured by cell projection (CP) electron beam (EB) lithography, which is a form of particle beam lithography. One feature of this logic design method is to take into account the stencil information, which affects EB writing time, to optimize the logic circuit. One application of this method is for the case that the stencil is pre-designed, and the logic design is optimized or at least improved using the stencil information, such as which cells cell patterns are included in the stencil. Another application is for the case that the stencil is not pre-designed, and the logic circuit and then the stencil are optimally designed so as to minimize or at least reduce the writing time, considering the restrictions related to the stencil and the shot count by CP and VSB. In either case, short EB writing time is realized while the circuit functionality is the same.

This invention may be applied to any type of particle beam lithography technology, including electron beam (EB) lithography, optical laser beam lithography and X-ray beam lithography, which transcribes patterns using at least two apertures (stencil masks) and which has a source of particle beams, such as optical laser beam and X-ray beam, as well as electron beam lithography.

In one embodiment, a method and system for particle beam lithography are disclosed, comprising predefining a cell library having a plurality of cell patterns associated with characteristic parameters of a cell, predefining a stencil mask for Cell Projection (CP) having a plurality of cell patterns with information from the cell library, adding stencil information which relates to particle beam lithography of each cell on the stencil mask to the cell library, fabricating the stencil mask, synthesizing and optimizing a logic circuit from a given functional description and constraints while considering the stencil information that relates to particle beam lithography, generating a layout design from the optimized logic circuit design, and forming the logic circuit on a substrate using the layout design and stencil mask by the Cell Projection (CP) particle beam lithography.

In one embodiment, a method and system for particle beam lithography are disclosed, comprising predefining a cell library having a plurality of cell patterns associated with characteristic parameters of a cell, predefining a stencil mask for Cell Projection (CP) having a plurality of cell patterns with information from the cell library, adding stencil information which relates to particle beam lithography of each cell on the stencil mask to the cell library, fabricating the stencil mask, synthesizing and optimizing a logic circuit from a functional description and constraints while considering the stencil information that relates to particle beam lithography, as a first optimization process, executing a timing analysis of the logic circuit, improving the logic circuit design by iteratively replacing cells to solve, or reduce, the problems which were found by the timing analysis, as a second optimization process, generating a layout design from the optimized logic circuit design, and forming the logic circuit on a substrate using the layout design and stencil mask by the Cell Projection (CP) particle beam lithography.

In one embodiment, a method and system for particle beam lithography is disclosed, comprising predefining a cell library having a plurality of cell patterns associated with characteristic parameters of a cell, predefining a stencil mask for Cell Projection (CP) having a plurality of cell patterns with information from the cell library, adding stencil information which relates to particle beam lithography of each cell on the stencil mask to the cell library, fabricating the stencil mask, synthesizing a logic circuit from a functional description and constraints in accordance with a logical component of the cell library without considering the stencil information, optimally mapping the logical cells in the circuit to corresponding physical cell implementations, which include stencil information, generating a layout design from the optimally mapped logic circuit design, and forming the logic circuit on a substrate using the layout design and stencil mask by the Cell Projection (CP) particle beam lithography.

In one embodiment, a method and system for particle beam lithography is disclosed, comprising predefining a cell library having a plurality of cell patterns associated with characteristic parameters of a cell, adding stencil restriction information which is needed to design a stencil mask for particle beam lithography to the cell library, defining 'Write Time Reduction Efficiency' for each cell, which reflects the difference between write time for the case of written by Cell Projection (CP) and for the case of written by variable shaped beam (VSB) methods, and adding this to the cell library, synthesizing and optimizing a logic circuit from a given functional description and constraints, considering Write Time Reduction Efficiency, designing a stencil mask by selecting cell patterns to be included in the stencil mask under the given stencil mask restriction information, considering the overall Write Time Reduction Efficiency of the stencil mask, fabricating the stencil mask, synthesizing and optimizing the logic circuit again from the functional description and constraints while considering the stencil information, generating a layout design from the optimized logic circuit design, and forming the logic circuit on a substrate using the layout design and stencil mask by the Cell Projection (CP) particle beam lithography.

In one embodiment, a data file for a cell library is disclosed, the data file comprising a plurality of cell patterns associated with characteristic parameters of a cell, and stencil information which relates to particle beam lithography of each cell on the stencil mask.

In one embodiment, a computer program product for synthesizing and optimizing a logic circuit from a given functional description and constraints is disclosed, the computer program product considering the stencil information that relates to particle beam lithography.

This invention introduces a 'Write Time Figure' which reflects the particle beam writing time of each cell as a parameter or constraint for optimization of the logic synthesis tool. Thus, the optimum solution in terms of writing time can be obtained by the characteristics of the logic synthesis algorithm.

In one embodiment, a data file for a cell library is disclosed, the data file comprising a plurality of cell patterns associated with characteristic parameters of a cell, and stencil restriction information which is needed to design a stencil mask for particle beam lithography.

In one embodiment, a software program for synthesizing and optimizing a logic circuit from a given functional description and constraints is disclosed, the software program considering stencil restriction information which is needed to design a stencil mask for particle beam lithography.

This invention introduces a 'Write Time Reduction Efficiency' (WTRE) which reflects the difference between write time for the case of Cell Projection (CP) and Variable Shaped Beam (VSB) as a parameter or constraint for optimization of a logic synthesis tool. Thus an optimum solution in terms of writing time reduction using cell projection can be obtained.

These and other objects and advantages of the present teachings will become more fully apparent from the following description taken in conjunction with the accompanying drawings.

DETAILED DESCRIPTION

Figure 1:
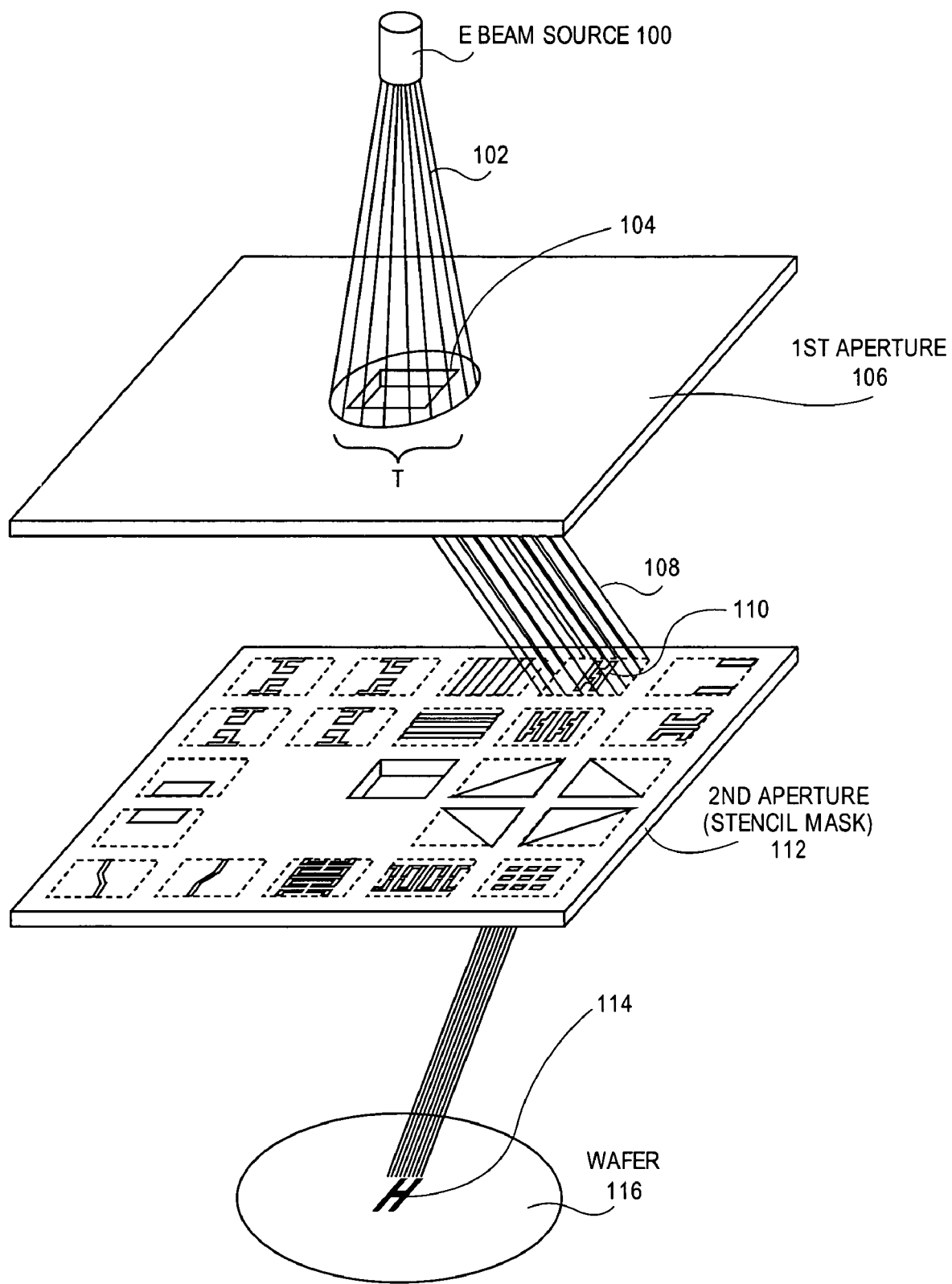
FIG. 1 shows a conventional electron beam writing machine and stencil mask configuration for projecting an image on a substrate.
Figure 2:
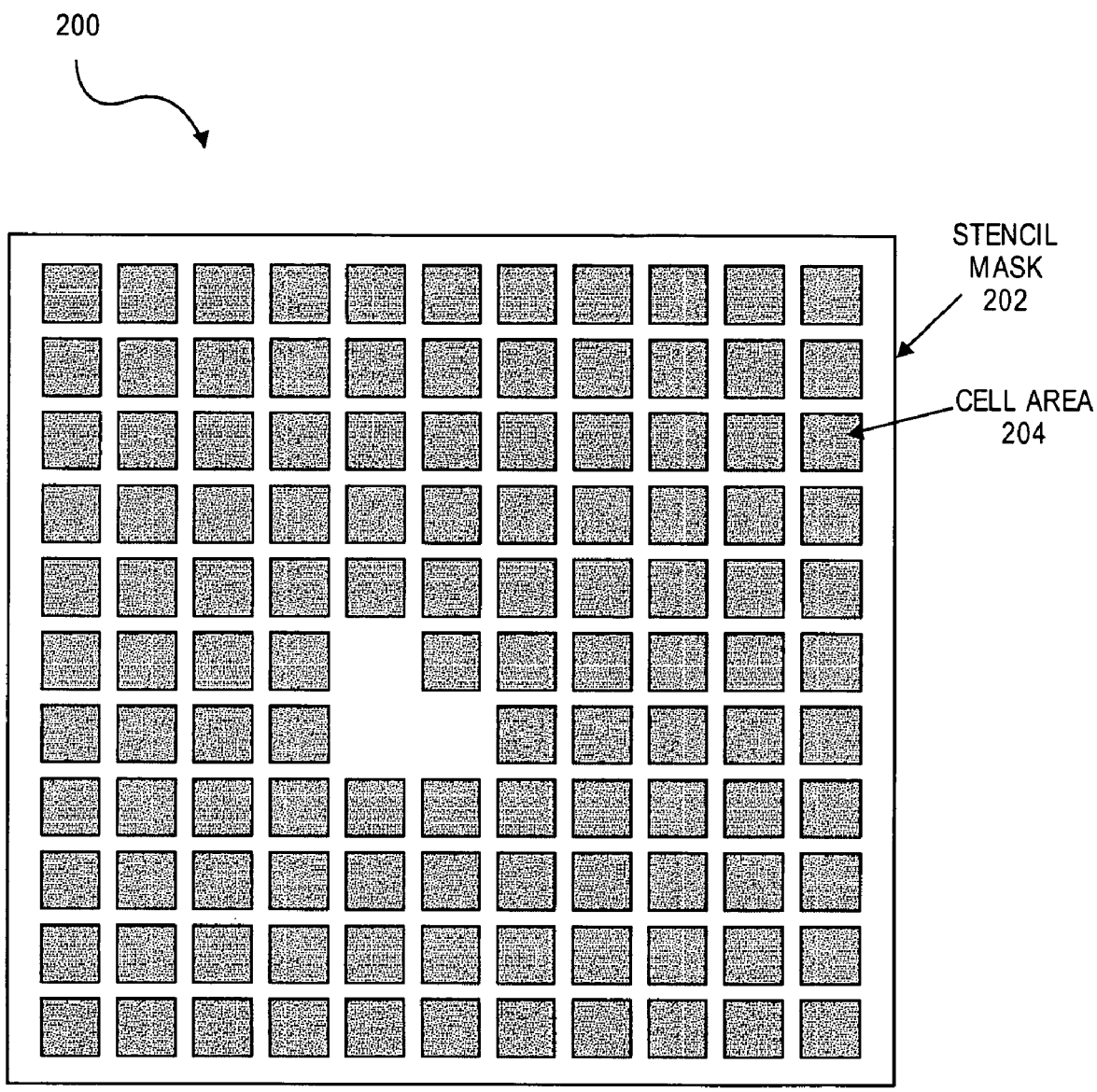
FIG. 2 shows an example of cell pattern layout on a stencil mask.
Figure 3:
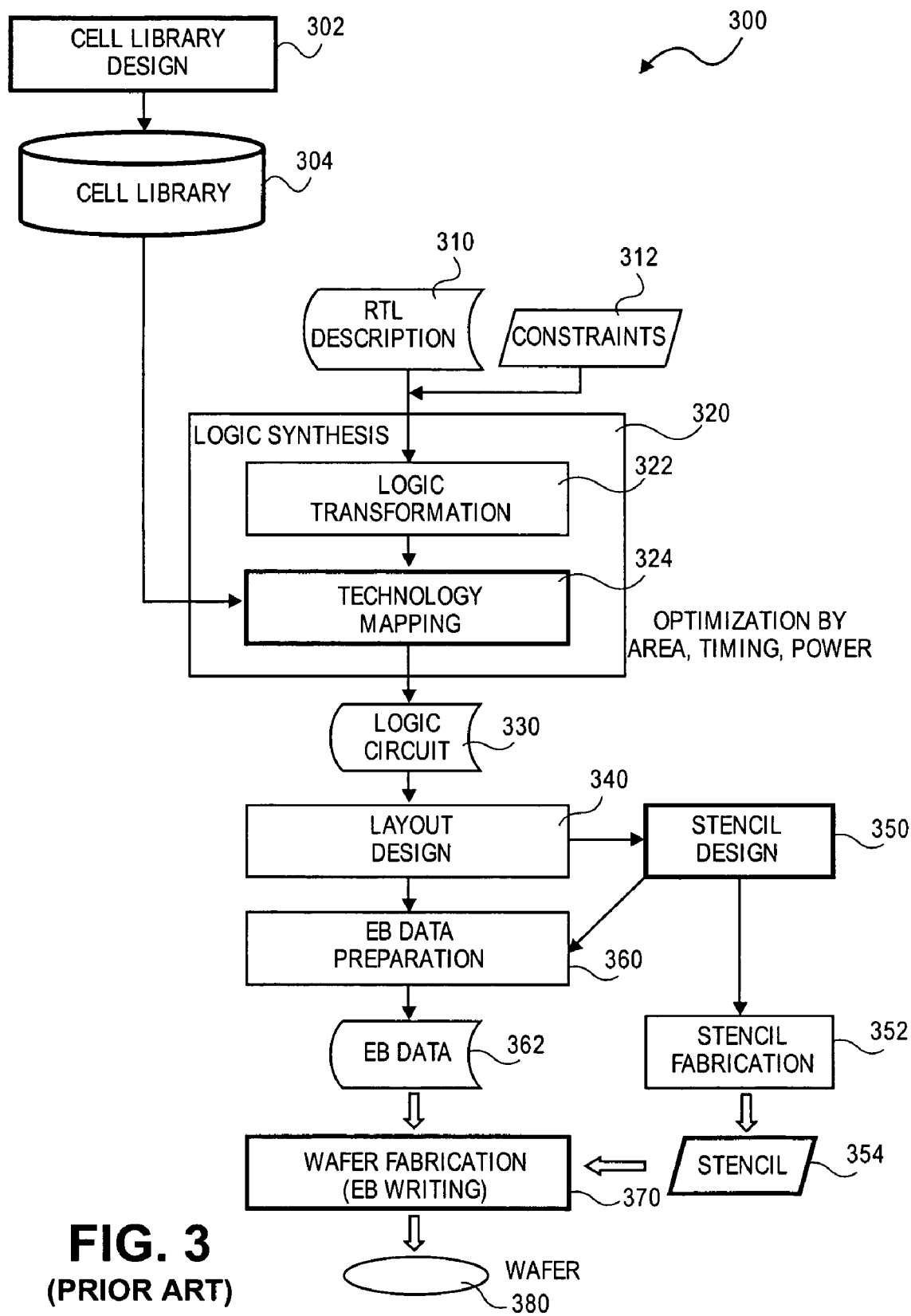
FIG. 3 shows a conventional LSI design flow including logic design and stencil design.

Various embodiments of the invention are described herein with reference to the drawings. It should be noted that the drawings are not drawn to scale and that elements of similar structures or functions are represented by like reference numerals throughout the drawings.

The following discussion mainly describes electron beam (EB) direct writing (EBDW) as an application of particle beam lithography. This invention should not be limited to only EB direct writing (EBDW), however. This invention can be applied in a similar manner to mask writing using an electron beam (EB) writer with cell projection (CP) capability, resulting in an improved throughput.

Accordingly, it should be appreciated that this invention may also be applied to other drawing technologies which transcribe patterns using at least two apertures (stencil masks) and using types of particle beams other than an electron beam (EB), such as an optical (light) laser beam, an X-ray beam or any other particle beams that can stimulate a sensitive material (resist) layer to form patterns on a substrate.

This invention provides a method for logic design of integrated circuits that enables a great reduction in the particle beam, such as electron beam (EB), writing time using cell projection (CP). The logic design method of this invention includes using particle beam writing time information in the logic optimization process.

It should be appreciated that this invention is a method for optimal design in the sense that the writing time is minimized by considering, for example, the characteristics of particle beam writing and restrictions from the stencil. Also, this invention provides a method of optimally designing stencils which provide short design times for most of circuits.

Some conventional ideas have been provided to reduce the number of cells needed to draw LSI chip patterns to reduce particle beam writing time. However, most of the conventional methods do not consider particle beam writing time during the logic design stage, but only do modifications in later stages in order to reduce the number of cell patterns which are drawn by CP.

In contrast, this invention optimizes the logic circuit using a 'Write Time Figure', which reflects particle beam writing time of each cell as the optimization parameter or constraint of logic synthesis. So, this invention is superior to conventional methods in the level of writing time improvement.

An innovative point of this invention is to enable optimum design of logic circuits by taking into account not only the restrictions of the stencil mask but also the shot count number, or writing time, of cells which are to be written by CP or by VSB, thus resulting in the minimum particle beam writing time. Another innovative point is that the stencil mask is defined before the logic design, providing a shorter particle beam writing time compared to the previous method, where the logic circuit is designed independently from the stencil. This invention can also be applied to designing a universally optimum stencil.

This invention includes a number of variations as follows, by the combination of whether the stencil is pre-designed or not, limitations from the stencil design, and the position of the logic optimization step in the design flow.

Figure 4:
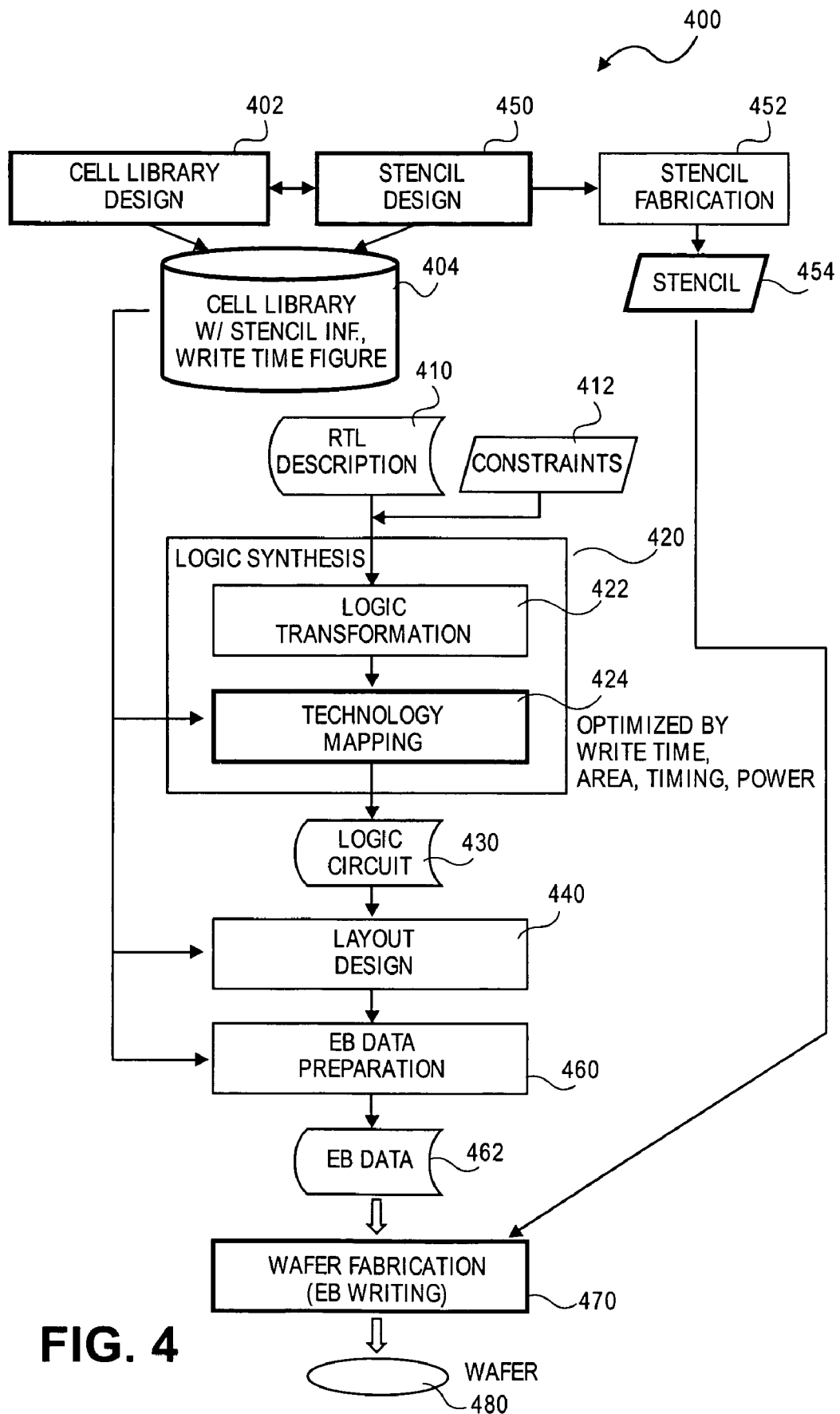
FIG. 4 shows one embodiment of an LSI design flow by the present invention.

Referring to FIG. 4, in a method 400 of LSI design of this invention, a cell library 402 is predefined and a stencil 454 is also predefined by stencil design 450 and fabricated 452 prior to LSI design, and a logic circuit design 430 is achieved considering the characteristics of the stencil 454 so that the writing time becomes minimum.

In one embodiment of method 400, a stencil 454 is designed 450 so that it includes frequently used cell patterns which can be drawn by CP. Other cells which are not included in the stencil have to be drawn by VSB.

In process 400, logic synthesis 420 is utilized as a technique for optimally designing logic circuits. Process 400 starts with a functional description 410, such as a register transfer level (RTL) description and various constraints 412 for the logic circuit design. The functional description 410 is transformed into a logic circuit 430 by a logic transformation 422 and is then converted by technology mapping 424 to the final logic circuit 430 which consists of cell entities from a given cell library 404, which is pre-designed for a given process technology, and which comprises stencil and writing time information along with a set of cells that have implementation details such as layout patterns and performance data. The layout design 440 and stencil design 450 are used for EB data preparation 460, and EB data 462 therefrom is used along with the stencil 454 to EB write and fabricate 470 the logic circuit 430 according to the layout design 440 on a wafer or substrate 480.

In the course of logic synthesis 420, stencil and writing time information are used, along with other parameters and constraints, for logic optimization. The layout design 440 and a cell library with stencil information 404 are used for EB data preparation 460, and EB data 462 therefrom is used along with the stencil 454 to EB write and fabricate 470 the logic circuit 430 according to the layout design 440 on a wafer or substrate 480.

In process 400, the cell library 404 is prepared to comprise a number, such as a 'Write Time Figure', that reflects the EB writing time for all of the layers of each cell. This 'Write Time Figure' is usually calculated by a linear equation of the shot counts needed to draw each layer of the cell, and in the simplest case is equal to the total shot count of all layers. The shot count of a cell which is not included in the stencil 454 is the number of fractured shapes needed to write the cell pattern for VSB, and the shot count of a cell which is included in the stencil 454 is 1 or a number of CP shots if the cell pattern is drawn by more than one cell projection shot.

However, in one aspect, the 'Write Time Figure' can be any function of the shot counts of each layer of the cells. Moreover, in another aspect, if only some layers are to be drawn by CP EBDW, only shot counts of those layers can be taken into account.

In one aspect, using such cell library 404, logic synthesis 420 is carried out under the condition that the summation of 'Write Time Figures' of all cells in the circuit is minimized. In other words, the summation of 'Write Time Figures' is used as the cost function of the logic optimization. This cost function for logic synthesis 420 is not limited to the summation of 'Write Time Figures' but can be any function of 'Write Time Figures' of all cells in the circuit.

As a special case of the above method, logic synthesis 420 can be done using only the cells that are included in the stencil 454. In this case, the circuit is composed with cells which can be drawn by CP. In one aspect, this case is equivalent to a special case that the cells which are not included in the stencil have an infinite, or large enough, value of the 'Write Time Figure'.

In the method 400 above, other parameters for logic optimization, such as delay, power and area, or any subset thereof, can be used in combination with the 'Write Time Figure'. Those parameters can be used not only as the parameters to optimize but also as the constraints for optimization. For example, a logic synthesis may be done to minimize the 'Write Time Figure' and area, in order of priority, and under given constraints of circuit timing. In one aspect, detailed types of optimization parameters and constraints, and the way of specifying them, depend on the specification of the logic synthesis tools used.

Figure 5A:
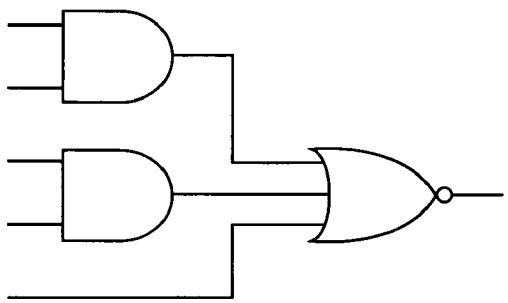
FIGS. 5(a)-5(d) show various implementations of a logic function.
Figure 5B:
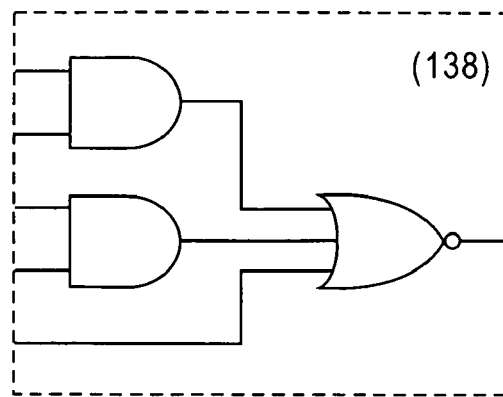
Figure 5C:
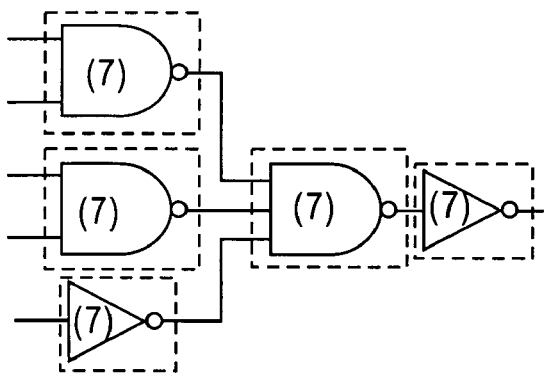
Figure 5D:
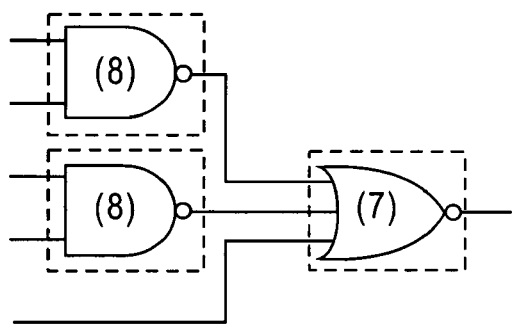

Referring to FIGS. 5(a)-5(d), some examples are shown for how differently a logic function can be implemented with varying shot counts and for how the invention can optimally select the cell patterns. FIG. 5(a) is an example of a standard cell (AND-NOR-221) used in the logic circuit. If this cell is included as a cell pattern on the stencil mask, the pattern can be drawn by one shot using CP, but if this cell is not included in the stencil mask and is drawn by VSB, total shot count becomes 138, as shown in 5(b). However, if the stencil mask includes other logic gates, such as inverting gates, and if the shot count information is used by the logic synthesis tool, a more optimized circuit, that is a circuit with a lower shot count, can be obtained, such as shown in 5(c). However, the needed chip area will be doubled. So, if other cell patterns, such as non-inverting gates, are added to the stencil, and if the chip area is also taken into account as one of the optimization parameters in addition to the shot count, another further optimized circuit, with less area penalty and with reasonably reduced shot count as shown by FIG. 5(d), can be obtained.

Figure 6:
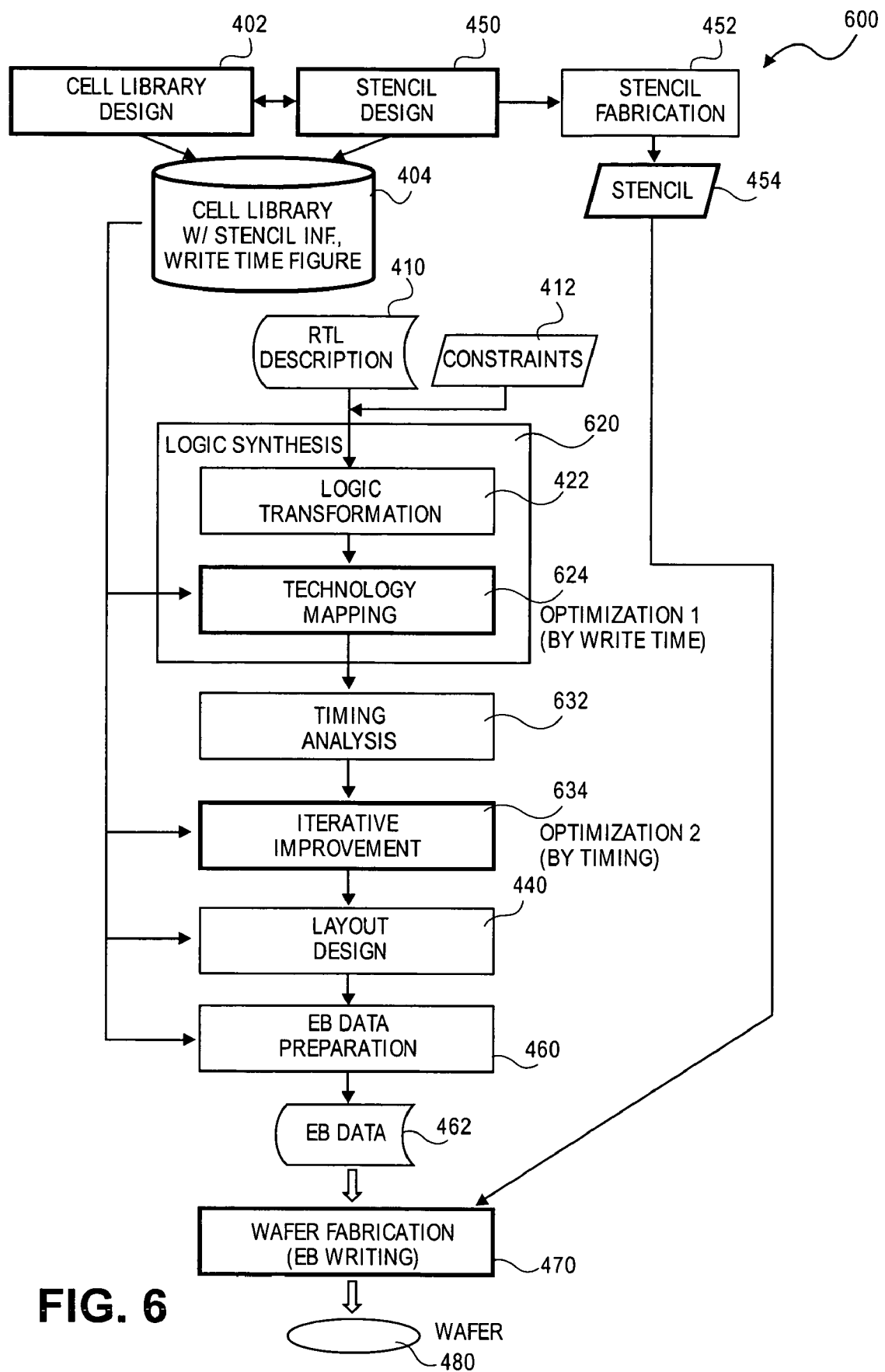
FIG. 6 shows another embodiment of an LSI design flow by the present invention.

Referring to FIG. 6, another method 600 of LSI design and stencil design may be utilized as an alternate to method 400 of FIG. 4.

In the method 600, a logic optimization process 624 can be divided into two or more steps, and some part of the optimization process can be done in later design stages by an iterative improvement method 634. For example, logic synthesis 620, as the first optimization step, may be done using only the 'Write Time Figure' to optimize in technology mapping 624, and the timing-problematic paths may be found using a circuit timing analysis tool 632. Then, a second optimization process of iterative improvement 634 may be carried out to solve these timing problems by iteratively replacing cells on the relevant path with other functionally equivalent cells which have less delay but may have bigger 'Write Time Figures'. This optimization step improves the circuit performance so that it meets the given timing constraints, with a possible slight penalty of write time and chip area.

In one aspect, such iterative improvement 634 can be achieved in any other later stage of the chip design, such as after floor planning, after routing, or after physical verification.

Figure 7:
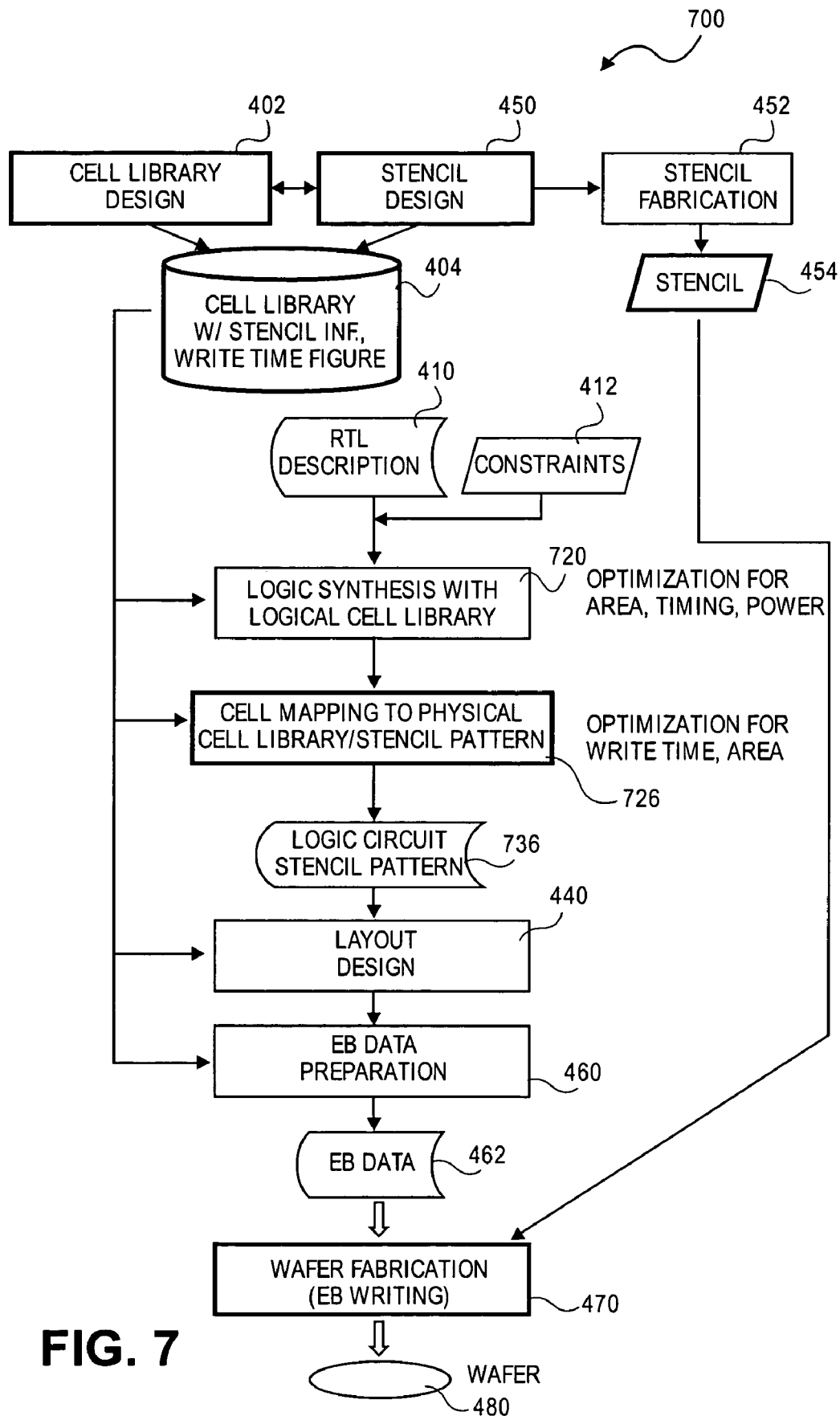
FIG. 7 shows still another embodiment of an LSI design flow by the present invention

Referring to FIG. 7, in another embodiment of a method 700 of LSI design and stencil design of this invention, logic synthesis 720 and optimization for EBDW 726 may be separated. In one aspect, the logic synthesis 720 may be achieved using the "logical" standard cell library in a conventional manner, where only conventional parameters such as area, timing and power are considered to optimize the circuit. Then, each logical cell is mapped to a corresponding "physical" cell, which has a physical implementation, a layout pattern and a stencil CP pattern 736. The physical cell library has the relation between the logical cell and the corresponding physical cells, which can be plural, and each physical cell has the 'Write Time Figure' and stencil related information, as described above in reference to process 400 (FIG. 4). This mapping is optimally achieved by using the information and optimization criteria described above in reference to process 400 (FIG. 4). An example of such plural implementations is a two input gate which is implemented by different layout patterns or by different stencil patterns. Another example is the case where a different part of the same stencil pattern is used by a partial projection technique.

In one or more of the methods described above, it may be supposed that a logic circuit is not changed after the logic design but before EB writing for manufacturing. However, it should be appreciated that in actual LSI development practice, some cells in the circuit, or the circuit connectivity itself, may be changed manually for some reason after logic design, or even after layout design. Also, in other cases the design is done manually, without using logic synthesis tools. In such cases, similar methods and criteria can be applied to select the new set of cells for the change so as to minimize the EB writing time.

Figure 8:
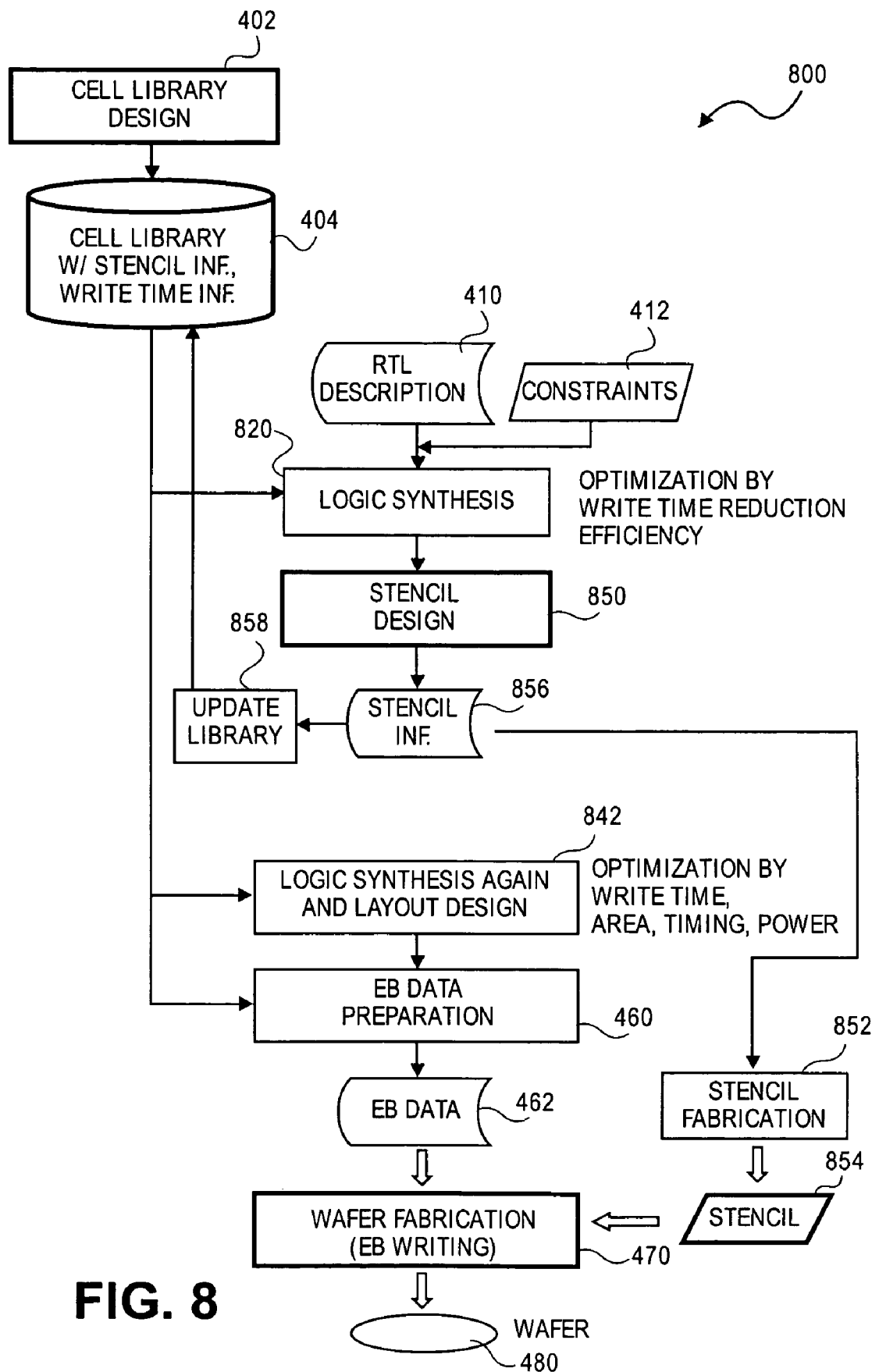
FIG. 8 shows one embodiment of an application of the present invention to a stencil design after logic design.

In one embodiment, this invention can also be applied to the case in which the stencil mask is not defined before the logic design. In this case the logic circuit is optimally designed, and then the stencil mask is optimally designed so that EB writing time using cell projection is minimized, as shown in FIG. 8. There are also several variations described herein below.

In one embodiment, referring to FIG. 8, to obtain an optimum circuit 842 and an optimum stencil 854, the 'Write Time Figures' for both the cases of CP writing and VSB writing for each cell in the library are required. The 'Write Time Figures' for the cases of VSB and CP may be defined as wv(i) and wc(i), respectively, for cell Ci. A 'Write Time Reduction Efficiency' (WTRE) for cell Ci may be defined as DW(i), which is the difference of write time when drawn by VSB and those when drawn by CP: DW(i)=wv(i)−wc(i).

In one aspect, under the condition that such parameters associated with each cell are stored in the cell library 404, and a maximum capacity of the stencil mask, such as a maximum number of cell patterns or a maximum total area of cell patterns are given, the method 800 to design an optimum circuit 842 and stencil mask 854 with stencil design step 850, stencil information 856 and stencil fabrication step 852 is as follows.

In the first stage (1A) for the temporary logic design, logic synthesis 820 is carried out so that the cells with larger DW(i) are used as much as possible, so as to be drawn by cell projection. In one aspect, a logic synthesis algorithm works to minimize parameters. To utilize this nature, the modified parameter may be used as a tool. For example; to use IW(i)=(C−DW(i)), where C is a constant that makes any IW(i) positive, or IW(i)=1/DW(i), the logic synthesis is carried out so that the total summation of IW(i) is minimized or so that the cells with small IW(i) are used as much as possible. If the logic synthesis tool has the capability to maximize the summation of parameters, DW(i) can be used as an optimization parameter or constraint. In one aspect, other parameters including area, timing and power may also be considered simultaneously with IW(i) or DW(i).

In one aspect, after logic synthesis 820, stencil design 850, and stencil information 856 for optimization is generated, the cell library 404 may be updated 858 with optimal stencil design and stencil information.

In the following stage (2A), stencil design 850, which comprises deciding which cells are to be included in the stencil mask 854, can be achieved by the following procedure, when the maximum number of cells on a stencil mask is given as CN. In one aspect, for each cell, calculate a 'Weighted Write Time Reduction Efficiency' (Weighted WTRE) which is defined by f(i) DW(i), where f(i) is the number of instances of cell Ci in this circuit, and then sort all cells by 'Weighted WTRE' in descending order. Select the first CN cells, which will have the highest 'Weighted WTRE'. These CN cells are ones which are to be included into the stencil mask 854.

In the final stage (3A) for final logic design, logic synthesis 842 is carried out again by the method described in the previous processes, 400, 600 or 700 using the stencil mask information 856 defined by above stage (2A).

In one aspect, it should be appreciated that the detailed algorithm to solve the problem is not limited to those described above.

In another embodiment, stage (1A) above can be replaced by another method of logic synthesis or logic design. The simplest method is to do the logic synthesis by just the usual manner without considering 'Write Time Reduction Efficiency', or even to use an existing, or previously designed, logic circuit without doing logic synthesis again.

In the above embodiments, only one logic circuit is considered to select the subset of cells to be written with CP. However, in another embodiment, more than one multiple circuit implementations which meet design constraints may be created by logic synthesis 820 and utilized to obtain an even more optimized solution. One example of the method for this is as follows.

In a stage (1B) generate more than one logic circuit implementations with same functionality by the logic synthesis tool as described in the stage (1A) above.

In a stage (2B), for each cell Ci of the superset calculate a 'Globally Weighted Write Time Reduction Efficiency', which is defined as f(i) DW(i), where f(i) is number of instances of cell Ci in all of the logic circuits, and sort all cells by 'Globally Weighted Write Time Reduction Efficiency' in descending order.

In a stage (3B), select the first CN cells which have highest 'Globally Weighted Write Time Reduction Efficiency'. These CN cells are ones which are to be included into the stencil mask 854.

In one aspect, it should be appreciated that the detailed algorithm to solve the problem is not limited to that described above.

By applying the methods described above, a universally optimum (optimum for many circuits) stencil can be designed, if multiple sample circuits are considered. Namely, after determining an optimum subset of cell library cells which will constitute the stencil for each of the given sample circuits using the method described above, select the top CN cells which appear most frequently in all of those subsets. In one aspect, it should be appreciated that the actual algorithm to select the top CN cells is not limited to that described above.

In one or more of the methods described above, it may be supposed that the logic circuit and the used cells are not changed after logic design but before the EB writing step for manufacturing. However, in actual LSI development practice, some cells in the circuit or the circuit connectivity itself may be changed after logic design or even after layout design. In such cases a criteria similar to that described above can be applied to select the new set of cells for the change so as to minimize the EB writing time.

This invention includes cell library or technology files that include stencil information and other information which affects the EB writing time. Also, this invention includes the software tools or systems that enable the above-described methods, either automatically or semi-automatically.

Although particular embodiments of the invention have been shown and described, it will be understood that it is not intended to limit the invention to the preferred embodiments, and it will be obvious to those skilled in the art that various changes and modifications may be made without departing from the scope of the invention. The specification and drawings are, accordingly, to be regarded in an illustrative rather than restrictive sense. The invention is intended to cover alternatives, modifications, and equivalents, which may be included within the scope of the invention as defined by the claims.

What is claimed is:

1. A method for particle beam lithography comprising:
   predefining a cell library having a plurality of cell patterns associated with characteristic parameters of a cell;
   predefining a stencil mask for Cell Projection (CP) having a plurality of cell patterns with information from the cell library;
   adding stencil information which relates to particle beam lithography of each cell for the stencil mask to the cell library;
   fabricating the stencil mask;
   synthesizing and optimizing a logic circuit from a given functional description and constraints, considering the stencil information that relates to particle beam lithography;
   generating a layout design from the optimized logic circuit design; and
   forming the logic circuit on a substrate using the layout design and stencil mask by the Cell Projection (CP) particle beam lithography.

2. The method of claim 1, wherein the particle beam lithography comprises electron beam (EB) lithography.

3. The method of claim 1, wherein the particle beam lithography comprises optical (light) laser lithography.

4. The method of claim 1, wherein the particle beam lithography comprises X-ray beam lithography.

5. The method of claim 1, wherein the stencil information added to the cell library includes the 'Write Time Figure' which reflects the particle beam writing time for at least one layer of each cell pattern, or the total writing time for all relevant layers of each cell.

6. The method of claim 5, wherein the 'Write Time Figure' reflects a shot count, which is necessary to draw using particle beam, for each layer of each cell, or the summation for all the relevant layers of each cell.

7. The method of claim 1, wherein the stencil mask is designed so as to include the most frequently used cell patterns.

8. The method of claim 1, wherein the logic synthesis and optimization step is carried out so that the total writing time by particle beam is minimized.

9. The method of claim 8, wherein the logic synthesis and optimization step is carried out so that the summation of the 'Write Time Figure' for all cells used in the logic circuit is minimized.

10. The method of claim 8, wherein the logic synthesis and optimization step is carried out so that at least one of delay (timing information), power consumption, and area (physical size) is minimized in addition to the total writing time by particle beam being minimized.

11. The method of claim 10, wherein the logic synthesis and optimization step is are carried out so that at least one of delay (timing information), power consumption, and area (physical size) is considered as one of the constraints for the optimization which tries to minimize other parameters.

12. The method of claim 8, wherein the logic synthesis and optimization step is carried out using only the cells which are included in the stencil mask.

13. A method for particle beam lithography comprising:
    predefining a cell library having a plurality of cell patterns associated with characteristic parameters of a cell;
    predefining a stencil mask for Cell Projection (CP) having a plurality of cell patterns with information from the cell library;
    adding stencil information which relates to particle beam lithography of each cell for the stencil mask to the cell library;
    fabricating the stencil mask;
    synthesizing and optimizing a logic circuit from a functional description and constraints, considering the stencil information that relates to particle beam lithography, as a first optimization process;
    executing a timing analysis of the logic circuit;
    improving the logic circuit design by iteratively replacing cells to solve, or reduce, the problems which were found by the timing analysis, as a second optimization process;
    generating a layout design from the improved logic circuit design; and
    forming the logic circuit on a substrate using the layout design and stencil mask by the Cell Projection (CP) particle beam lithography.

14. The method of claim 13, wherein the particle beam lithography comprises electron beam (EB) lithography.

15. The method of claim 13, wherein the particle beam lithography comprises optical (light) laser lithography.

16. The method of claim 13, wherein the particle beam lithography comprises X-ray beam lithography.

17. The method of claim 13, wherein the stencil information added to the cell library includes the 'Write Time Figure' which reflects the particle beam writing time for at least one layer of each cell pattern, or the total writing time for all relevant layers of each cell.

18. The method of claim 17, wherein the 'Write Time Figure' reflects a shot count, which is necessary to draw using particle beam, for each layer of each cell, or the summation for all the relevant layers of each cell.

19. The method of claim 13, wherein the stencil mask is designed so as to include the most frequently used cell patterns.

20. The method of claim 13, wherein the logic synthesis and optimization step is carried out so that the total writing time by particle beam is minimized.

21. The method of claim 17, wherein the logic synthesis and optimization step is carried out so that the summation of the 'Write Time Figure' for all cells used in the optimized logic circuit is minimized.

22. The method of claim 13, wherein the timing analysis is executed by using any of a static timing analysis tool, a statistical statistic timing analysis tool, a logic simulator, a circuit simulator, or any other tool that can analyze the circuit to find out the timing problems of the circuit.

23. The method of claim 13, wherein the analysis is not limited to timing, but at least one of power consumption analysis and chip area analysis are executed instead of, or in addition to, the timing analysis.

24. The method of claim 13, wherein the iterative replacement of the cells is done one by one, or group by group, to improve the circuit design.

25. The method of claim 13, wherein the iterative improvement is done after layout design instead of, or in addition to the improvement before layout design.

26. A method for particle beam lithography comprising:
predefining a cell library having a plurality of cell patterns associated with characteristic parameters of a cell;
predefining a stencil mask for Cell Projection (CP) having a plurality of cell patterns with information from the cell library;
adding stencil information which relates to particle beam lithography of each cell for the stencil mask to the cell library;
fabricating the stencil mask;
synthesizing a logic circuit from a functional description and constraints in accordance with a logical component of the cell library without considering the stencil information;
optimally mapping the logical cells in the circuit to corresponding physical cell implementations, which include stencil information;
generating a layout design from the optimally mapped logic circuit design; and
forming the logic circuit on a substrate using the layout design and stencil mask by the Cell Projection (CP) particle beam lithography.

27. The method of claim 26, wherein the particle beam lithography comprises electron beam (EB) lithography.

28. The method of claim 26, wherein the particle beam lithography comprises optical (light) laser lithography.

29. The method of claim 26, wherein the particle beam lithography comprises X-ray beam lithography.

30. The method of claim 26, wherein the stencil information added to the cell library includes the 'Write Time Figure' which reflects the particle beam writing time for at least one layer of each cell pattern, or the total writing time for all relevant layers of each cell.

31. The method of claim 30, wherein the 'Write Time Figure' reflects shot count, which is necessary to draw using particle beam, for each layer of each cell, or the summation for all the relevant layers of each cell.

32. The method of claim 26, wherein the stencil mask is designed so as to include the most frequently used cell patterns.

33. The method of claim 26, wherein the cell library includes a logic function that has a plurality of physical implementations, each of the physical implementations including a layout pattern and a stencil pattern.

34. The method of claim 26, wherein the optimal mapping of the logical cells to the physical cell implementations is carried out so that the total writing time by particle beam is minimized.

35. The method of claim 31, wherein the optimal mapping is carried out so that the summation of the 'Write Time Figure' for all cells used in the circuit is minimized.

36. The method of claim 26, wherein an analysis of timing or other characteristics is performed after cell mapping to make sure that the design meets the constraints.

37. The method of claim 26, wherein the logic synthesis is executed by any means including totally by manual, partially by manual, or by any other means.

38. A method for particle beam lithography comprising:
predefining a cell library having a plurality of cell patterns associated with characteristic parameters of a cell;
adding stencil restriction information which is needed to design a stencil mask for particle beam lithography to the cell library;
defining a 'Write Time Reduction Efficiency' for each cell, which reflects the difference between write time for the case of written by Cell Projection (CP) and for the case of written by variable shaped beam (VSB) methods, and adding this to the cell library;
synthesizing and optimizing a logic circuit from a given functional description and constraints, considering the Write Time Reduction Efficiency (WTRE);
designing a stencil mask by selecting cell patterns to be included in the stencil mask under the given stencil mask restriction information, considering the overall Write Time Reduction Efficiency of the stencil mask;
fabricating the stencil mask;
synthesizing and optimizing the logic circuit again from the functional description and constraints, considering the stencil information;
generating a layout design from the optimized logic circuit design; and
forming the logic circuit on a substrate using the layout design and stencil mask by the Cell Projection (CP) particle beam lithography.

39. The method of claim 38, wherein the particle beam lithography comprises electron beam (EB) lithography.

40. The method of claim 38, wherein the particle beam lithography comprises optical (light) laser lithography.

41. The method of claim 38, wherein the particle beam lithography comprises X-ray beam lithography.

42. The method of claim 38, wherein the Write Time Reduction Efficiency (WTRE) for each cell reflects the difference between a shot count needed to draw using CP and a shot count needed to draw by VSB.

43. The method of claim 38, wherein the first logic synthesis and optimization step is carried out so that the total WTRE of all cells used in the circuit is maximized.

44. The method of claim 38, wherein the first logic synthesis and optimization step is carried out so that the summation of the inverse of WTRE of all cells used in the circuit is minimized.

45. The method of claim 38, wherein the first logic synthesis and optimization step is carried out so that at least one of delay (timing information), power consumption, and area (physical size) is minimized in addition to the total WTRE being maximized.

46. The method of claim 45, wherein the first logic synthesis and optimization step is carried out so that at least one of delay (timing information), power consumption, and area (physical size) is considered as one of the constraints for the optimization.

47. The method of claim 38, wherein designing the stencil is carried out by:
calculating a 'Weighted Write Time Reduction Efficiency', which is the WTRE multiplied by the number of instances of a cell, for all the cells; and then
selecting the top CN cells with the highest 'Weighted Write Time Reduction Efficiency', where CN is the maximum number of cells that can be included in the stencil mask.

48. The method of claim 38, wherein a plurality of logic circuits are synthesized and optimized from the given functional description and constraints, in order for use in designing the stencil mask.

49. The method of claim 48, wherein designing the stencil mask is carried out by the following steps:
designing a candidate stencil, namely selecting a candidate set of cells for the stencil, for each of the logic circuits; and then
selecting the most frequently used CN cells in all the candidate sets of cells, where CN is the maximum number of cells that can be included in a stencil mask, for each logic circuit.

50. The method of claim 48, wherein designing the stencil mask is carried out by the following steps:
calculating a 'Globally Weighted WTRE', which is the WTRE multiplied by the total number of instances of a cell in the plurality of logic circuits, for all the cells used; and then
selecting the top CN cells with the highest 'Globally Weighted WTRE', where CN is the maximum number of cells that can be included in a stencil mask, for each logic circuit.

51. The method of claim 38, wherein a plurality of logic circuits are synthesized and optimized from different sets of functional descriptions and constraints, in order for use in designing the stencil mask.

52. The method of claim 51, wherein designing the stencil mask is carried out by the following steps:
designing a candidate stencil, namely selecting a candidate set of cells for the stencil, for each of the logic circuits; and then
selecting the most frequently used CN cells in all the candidate sets of cells, where CN is the maximum number of cells that can be included in a stencil mask, for each logic circuit.

53. The method of claim 51, wherein designing the stencil mask is carried out by the following steps:
calculating a 'Globally Weighted WTRE', which is the WTRE multiplied by the total number of instances of a cell in the plurality of logic circuits, for all the cells used; and then
selecting the top CN cells with the highest 'Globally Weighted WTRE', where CN is the maximum number of cells that can be included in a stencil mask, for each logic circuit.

54. A system for particle beam lithography comprising:
means for predefining a cell library having a plurality of cell patterns associated with characteristic parameters of a cell;
means for predefining a stencil mask for Cell Projection (CP) having a plurality of cell patterns with information from the cell library;
means for adding stencil information which relates to particle beam lithography of each cell for the stencil mask to the cell library;
means for fabricating the stencil mask;
means for synthesizing and optimizing a logic circuit from a given functional description and constraints, considering the stencil information that relates to particle beam lithography;
means for generating a layout design from the optimized logic circuit design; and
means for forming the logic circuit on a substrate using the layout design and stencil mask by the Cell Projection (CP) particle beam lithography.

55. An article of manufacture comprising a computer readable medium storing instructions which, when executed by a processing system, cause system to perform a method for particle beam lithography, the method comprising:
predefining a cell library having a plurality of cell patterns associated with characteristic parameters of a cell;
predefining a stencil mask for Cell Projection (CP) having a plurality of cell patterns with information from the cell library;
adding stencil information which relates to particle beam lithography of each cell for the stencil mask to the cell library;
fabricating the stencil mask;
synthesizing and optimizing a logic circuit from a given functional description and constraints, considering the stencil information that relates to particle beam lithography;
generating a layout design from the optimized logic circuit design; and
forming the logic circuit on a substrate using the layout design and stencil mask by the Cell Projection (CP) particle beam lithography.

56. A system for particle beam lithography comprising:
means for predefining a cell library having a plurality of cell patterns associated with characteristic parameters of a cell;
means for predefining a stencil mask for Cell Projection (CP) having a plurality of cell patterns with information from the cell library;
means for adding stencil information which relates to particle beam lithography of each cell for the stencil mask to the cell library;
means for fabricating the stencil mask;
means for synthesizing and optimizing a logic circuit from a functional description and constraints, considering the stencil information that relates to particle beam lithography, as a first optimization process;
means for executing a timing analysis of the logic circuit;
means for improving the logic circuit design by iteratively replacing cells to solve, or reduce, the problems which were found by the timing analysis, as a second optimization process;
means for generating a layout design from the improved logic circuit design; and
means for forming the logic circuit on a substrate using the layout design and stencil mask by the Cell Projection (CP) particle beam lithography.

57. An article of manufacture comprising a computer readable medium storing instructions which, when executed by a processing system, cause the system to perform a method for particle beam lithography, the method comprising:

predefining a cell library having a plurality of cell patterns associated with characteristic parameters of a cell;
predefining a stencil mask for Cell Projection (CP) having a plurality of cell patterns with information from the cell library;
adding stencil information which relates to particle beam lithography of each cell for the stencil mask to the cell library;
fabricating the stencil mask;
synthesizing and optimizing a logic circuit from a functional description and constraints, considering the stencil information that relates to particle beam lithography, as a first optimization process;
executing a timing analysis of the logic circuit;
improving the logic circuit design by iteratively replacing cells to solve, or reduce, the problems which were found by the timing analysis, as a second optimization process;
generating a layout design from the improved logic circuit design; and
forming the logic circuit on a substrate using the layout design and stencil mask by the Cell Projection (CP) particle beam lithography.

58. A system for particle beam lithography comprising:
means for predefining a cell library having a plurality of cell patterns associated with characteristic parameters of a cell;
means for predefining a stencil mask for Cell Projection (CP) having a plurality of cell patterns with information from the cell library;
means for adding stencil information which relates to particle beam lithography of each cell for the stencil mask to the cell library;
means for fabricating the stencil mask;
means for synthesizing a logic circuit from a functional description and constraints in accordance with a logical component of the cell library without considering the stencil information;
means for optimally mapping the logical cells in the circuit to corresponding physical cell implementations, which include stencil information;
means for generating a layout design from the optimally mapped logic circuit design; and
means for forming the logic circuit on a substrate using the layout design and stencil mask by the Cell Projection (CP) particle beam lithography.

59. An article of manufacture comprising a computer readable medium storing instructions which, when executed by a processing system, cause the system to perform a method for particle beam lithography, the method comprising:

predefining a cell library having a plurality of cell patterns associated with characteristic parameters of a cell;
predefining a stencil mask for Cell Projection (CP) having a plurality of cell patterns with information from the cell library;
adding stencil information which relates to particle beam lithography of each cell for the stencil mask to the cell library;
fabricating the stencil mask;
synthesizing a logic circuit from a functional description and constraints in accordance with a logical component of the cell library without considering the stencil information;
optimally mapping the logical cells in the circuit to corresponding physical cell implementations, which include stencil information;
generating a layout design from the optimally mapped logic circuit design; and
forming the logic circuit on a substrate using the layout design and stencil mask by the Cell Projection (CP) particle beam lithography.

60. A system for particle beam lithography comprising:
means for predefining a cell library having a plurality of cell patterns associated with characteristic parameters of a cell;
means for adding stencil restriction information which is needed to design a stencil mask for particle beam lithography to the cell library;
means for defining a 'Write Time Reduction Efficiency' for each cell, which reflects the difference between write time for the case of written by Cell Projection (CP) and for the case of written by variable shaped beam (VSB) methods, and adding this to the cell library;
means for synthesizing and optimizing a logic circuit from a given functional description and constraints, considering the Write Time Reduction Efficiency (WTRE);
means for designing a stencil mask by selecting cell patterns to be included in the stencil mask under the given stencil mask restriction information, considering the overall Write Time Reduction Efficiency of the stencil mask;
means for fabricating the stencil mask;
means for synthesizing and optimizing the logic circuit again from the functional description and constraints, considering the stencil information;
means for generating a layout design from the optimized logic circuit design; and
means for forming the logic circuit on a substrate using the layout design and the stencil mask by the Cell Projection (CP) particle beam lithography.

61. An article of manufacture comprising a computer readable medium storing instructions which, when executed by a processing system, cause the system to perform a method for particle beam lithography, the method comprising:

predefining a cell library having a plurality of cell patterns associated with characteristic parameters of a cell;
adding stencil restriction information which is needed to design a stencil mask for particle beam lithography to the cell library;
defining a 'Write Time Reduction Efficiency' for each cell, which reflects the difference between write time for the case of written by Cell Projection (CP) and for the case of written by variable shaped beam (VSB) methods, and adding this to the cell library;
synthesizing and optimizing a logic circuit from a given functional description and constraints, considering the Write Time Reduction Efficiency (WTRE);
designing a stencil mask by selecting cell patterns to be included in the stencil mask under the given stencil mask restriction information, considering the overall time reduction efficiency Write Time Reduction Efficiency of the stencil mask;
fabricating the stencil mask;
synthesizing and optimizing the logic circuit again from the functional description and constraints, considering the stencil information;
generating a layout design from the optimized logic circuit design; and
forming the logic circuit on a substrate using the layout design and the stencil mask by the Cell Projection (CP) particle beam lithography.

* * * * *